(12) United States Patent
Xia et al.

(10) Patent No.: US 12,432,940 B2
(45) Date of Patent: Sep. 30, 2025

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventors: Jun Xia, Hefei (CN); Shijie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 607 days.

(21) Appl. No.: 17/804,178

(22) Filed: May 26, 2022

(65) Prior Publication Data
US 2023/0133297 A1 May 4, 2023

Related U.S. Application Data

(63) Continuation of application No. PCT/CN2021/135767, filed on Dec. 6, 2021.

(30) Foreign Application Priority Data

Nov. 4, 2021 (CN) .......................... 202111298101.8

(51) Int. Cl.
*H10D 1/00* (2025.01)
*H10B 12/00* (2023.01)
*H10D 1/68* (2025.01)

(52) U.S. Cl.
CPC ............. *H10D 1/042* (2025.01); *H10D 1/716* (2025.01)

(58) Field of Classification Search
CPC ........ H10D 1/042; H10D 1/716; H10D 1/043; H10B 12/033
See application file for complete search history.

(56) References Cited

U.S. PATENT DOCUMENTS

| 6,372,572 | B1 | 4/2002 | Yu et al. |
| 2002/0127854 | A1 | 9/2002 | Kang |
| 2011/0012237 | A1 | 1/2011 | Pierrat |
| 2015/0140823 | A1 | 5/2015 | Su |
| 2016/0027783 | A1* | 1/2016 | Koge ................... H10B 12/315 438/386 |
| 2017/0069633 | A1 | 3/2017 | Kim et al. |
| 2017/0178914 | A1 | 6/2017 | Prasad et al. |

(Continued)

FOREIGN PATENT DOCUMENTS

| CN | 103663357 A | 3/2014 |
| CN | 110265290 A | 9/2019 |

(Continued)

OTHER PUBLICATIONS

U.S. office action in U.S. Appl. No. 17/974,540, mailed on Jun. 12, 2025.

*Primary Examiner* — Omar F Mojaddedi
(74) *Attorney, Agent, or Firm* — SYNCODA LLC; Feng Ma

(57) ABSTRACT

A method for manufacturing a semiconductor structure comprises: forming a stacked structure on a base having an array area and a peripheral area; forming a first mask layer on the stacked structure, in which the first mask layer corresponding to the array area has a first pattern; ion doping the first mask layer on the array area to obtain a doped first mask layer; and etching the stacked structure through the doped first mask layer to transfer the first pattern to the stacked structure.

13 Claims, 19 Drawing Sheets

(56) References Cited

U.S. PATENT DOCUMENTS

| | | | |
|---|---|---|---|
| 2017/0345886 A1* | 11/2017 | Yi | H10D 1/716 |
| 2018/0182636 A1 | 6/2018 | Prasad et al. | |
| 2020/0020695 A1* | 1/2020 | Leobandung | H10D 86/481 |
| 2021/0151439 A1* | 5/2021 | Choi | H01L 21/7682 |
| 2021/0375625 A1* | 12/2021 | Cho | H01L 21/31144 |

FOREIGN PATENT DOCUMENTS

| | | |
|---|---|---|
| CN | 112582414 A | 3/2021 |
| JP | 2007335660 A | 12/2007 |
| KR | 20060010927 A | 2/2006 |

\* cited by examiner

SEMICONDUCTOR STRUCTURE AND METHOD FOR MANUFACTURING SAME

CROSS-REFERENCE OF RELATED APPLICATIONS

This is a continuation of International Application No. PCT/CN2021/135767 filed on Dec. 6, 2021, which claims priority to Chinese Patent Application No. 202111298101.8 filed on Nov. 4, 2021. The disclosures of these applications are hereby incorporated by reference in their entirety.

BACKGROUND

Dynamic random access memory (DRAM) includes an array area consisting of a plurality of memory cells and a peripheral area where the control circuit is located. With the rapid development of semiconductor memory technology, the market has put forward higher requirements for the storage capacity of semiconductor memory products. For dynamic random access memory, the distribution density of storage capacitors and the storage capacity of a single capacitor restrict the storage capacity and stability of capacitor storage.

SUMMARY

The disclosure relates to the technical field of semiconductor, and relates to but is not limited to, a semiconductor structure and a method for manufacturing the same.

The embodiments of the disclosure provide a semiconductor structure and a method for manufacturing the same.

In the first aspect, the embodiments of the disclosure provide a method for manufacturing a semiconductor structure comprising forming a stacked structure on a base having an array area and a peripheral area; forming a first mask layer on the stacked structure, in which the first mask layer corresponding to the array area has a first pattern; on doping the first mask layer on the array area to obtain a doped first mask layer; and etching the stacked structure through the doped first mask layer to transfer the first pattern to the stacked structure.

In the second aspect, embodiments of the disclosure provide a semiconductor structure manufactured by the above method for manufacturing a semiconductor structure. The semiconductor structure at least comprises: a base and a capacitor structure, in which the base comprises a contact structure; the capacitor structure is located on a surface of the base, and the capacitor structure is in contact with the contact structure.

BRIEF DESCRIPTION OF THE DRAWINGS

In the accompanying drawings (which may not be drawn to scale), the similar reference numerals may describe similar components in different views. The similar reference numerals with different letter suffixes may denote different examples of similar components. The drawings generally illustrate, by way of examples and not limitation, various embodiments discussed herein.

DETAILED DESCRIPTION

Figure 1A:
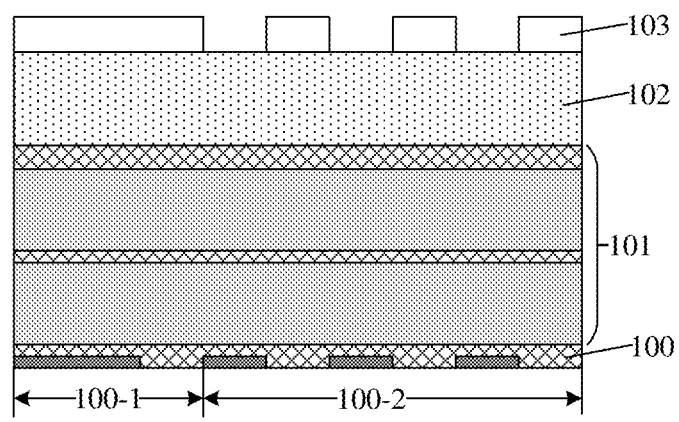
FIG. 1A illustrates a first structural schematic diagram of a semiconductor structure forming process provided by an embodiment of the present disclosure.

Exemplary embodiments of the present disclosure will be described in more detail below with reference to the accompanying drawings. Although exemplary embodiments of the present disclosure are shown in the drawings, it should be understood that the present disclosure may be embodied in various forms which will not be limited to the specific embodiments set forth herein. These embodiments are provided for the purpose that the disclosure will be more thoroughly understood and the scope of the disclosure will be fully conveyed to those skilled in the art.

In the description below, numerous specific details are given for thorough understanding of the disclosure. However, it will be apparent to those skilled in the art that the disclosure may be implemented without one or more of these details. In other examples, some technical features well-known in the art are not described in order to avoid confusion with the present disclosure; that is, not all of the features of actual embodiments are described herein, and well-known functions and structures are not described in detail.

In the drawings, the dimensions of layers, regions, elements and their relative dimensions may be exaggerated for clarity. The same reference numeral denotes the same element throughout the text.

It should be understood that when an element or a layer is referred to as "on", "adjacent to", "connected to" or "coupled to" another element or layer, it may be directly on the other element or layer, adjacent to the other element or layer, or connected to or coupled to the other element or layer, or there may be an intermediate element or layer therebetween. In contrast, when an element is described as "directly on", "directly adjacent to", "directly connected to" or "directly coupled to" another element or layer, there is no intermediate element or layer therebetween. It should be understood that although the terms, "first", "second", "third" and the like may be used to describe various elements, components, regions, layers, and/or portions, these elements, components, regions, layers, and/or portions should not be limited by these terms. These terms are only used to distinguish one element, component, region, layer or portion from another element, component, region, layer or portion. Therefore, without departing from the teaching of the present disclosure, a first element, component, region, layer or portion discussed hereinafter may be expressed as a second element, component, region, layer or portion. While discussing a second element, component, region, layer or portion, it does not imply that a first element, component, region, layer or portion is necessarily present in the present disclosure.

The terms used herein are intended to describe specific embodiments only and are not to be a limitation to the present disclosure. As used herein, the singular forms "a/an", "one", and "the/said" are intended to include the plural forms as well, unless the context clearly dictates otherwise. It should be further understood that the terms "consist of" and/or "comprise/include" used in the specification, mean that the stated features, integers, steps, operations, elements and/or components are present, but the presence or addition of one or more of other features, integers, steps, operations, elements, components and/or combinations is not excluded. When used herein, the term "and/or" includes any of the listed items and all combinations thereof.

Before introducing in detail the method for forming the semiconductor structure provided by the embodiments of the present disclosure, the process for forming a semiconductor structure in some implementations will be described first.

Figure 1B:
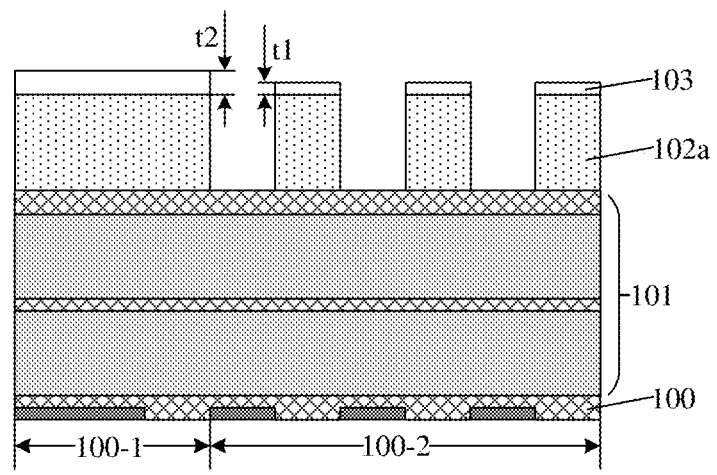
FIG. 1B illustrates a second structural schematic diagram of a semiconductor structure forming process provided by an embodiment of the present disclosure.
Figure 1C:
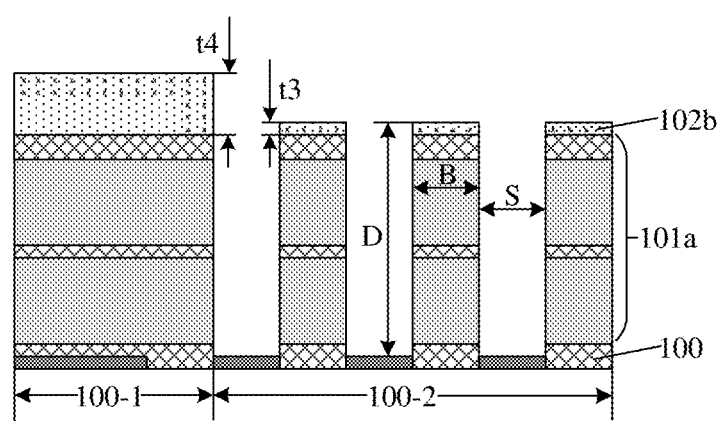
FIG. 1C illustrates a third structural schematic diagram of a semiconductor structure forming process provided by an embodiment of the present disclosure.

FIGS. 1A-1C illustrate structural schematic diagrams of a semiconductor structure forming process provided by an embodiment of the present disclosure. As shown in FIG. 1A, a stacked structure 101 is formed on the surface of a base 100, and a first hard mask layer 102 and a second hard mask layer 103 are formed on the surface of the stacked structure 101, in which the second hard mask layer 103 has a pattern for forming capacitor holes. The base 100 includes a peripheral area 100-1 and an array area 100-2, in which the pattern density of the pattern of capacitor holes in the second hard mask layer on the array area 100-2 is greater than that in the second hard mask layer on the peripheral area 100-1.

The process for forming the semiconductor structure includes two pattern transfer processes. In the first pattern transfer process, the first hard mask layer is etch through the second hard mask layer, so that the pattern of capacitor holes in the second hard mask layer is transferred to the first hard mask layer. As shown in FIG. 1B, the first pattern transfer process results in the first-etched first hard mask layer 102a. During the first pattern transfer process, the thickness t1 of the second hard mask layer 103 on the array area 100-2 is smaller than the thickness t2 of the second hard mask layer 103 on the peripheral area 100-1 due to the etch loading effect. In the second pattern transfer process, the stacked structure 101 is etched through the first-etched first hard mask layer 102a, so as to transfer the pattern of capacitor holes to the stacked structure 101. Before the second pattern transfer process is implemented, it is necessary to remove the second hard mask layer 103. As shown in FIG. 1C, the second pattern transfer process results in the formation of capacitor bars 101a and the second-etched first hard mask layer 102b. A capacitor bar 101a has a top dimension B and a height D, and the distance between two adjacent capacitor bars is denoted as S. During removing the second hard mask layer 103 and transferring the second pattern, the thickness t3 of the first hard mask layer on the array area 100-2 is smaller than the thickness t4 of the first hard mask layer on the peripheral area 100-1 due to the etch loading effect, and the first hard mask layer on the array area 100-2 has a different roughness from the first hard mask layer on the peripheral area 100-1.

After the pattern of capacitor holes is transferred to the stacked structure, the above said second-etched first hard mask layer 102b needs to be removed.

Another embodiment of the present disclosure provides a semiconductor structure and a method for manufacturing the same. The method for manufacturing a semiconductor structure comprises: forming a stacked structure on a base having an array area and a peripheral area; forming a first mask layer on the stacked structure, in which the first mask layer corresponding to the array area has a first pattern; ion doping the first mask layer on the array area to obtain a doped first mask layer; etching the stacked structure through the doped first mask layer to transfer the first pattern to the stacked structure. In the embodiments of the disclosure, by doping the part of the first mask layer on the array area, the first mask layer on the array area is allowed to have a different etching selectivity ratio from the first mask layer on the peripheral area, such that the etch loading effect brought out when etching different areas of the first mask layer can be counteracted, and thus the integrity of the capacitor bars and the capacity of the capacitor structure formed as such can be improved.

Figure 2:
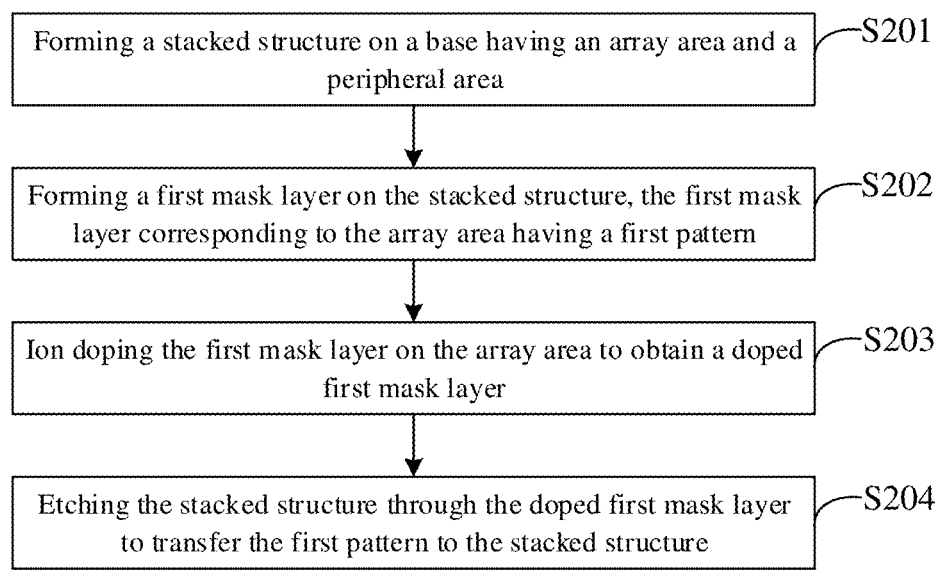
FIG. 2 is a schematic flowchart of a semiconductor structure forming process provided by another embodiment of the present disclosure.

FIG. 2 is a schematic flowchart of a semiconductor structure forming process provided by another embodiment of the present disclosure. As shown in FIG. 2, the process includes the following operations.

In S201, a stacked structure is formed on a base having an array area and a peripheral area.

The stacked structure is used for forming a capacitor structure, and the stacked structure includes a first sacrificial layer, a first support layer, a second sacrificial layer and a second support layer stacked in sequence from bottom to top. Herein, the first sacrificial layer and the second sacrificial layer may be oxide layers, such as silicon oxide layers; the first support layer and the second support layer may be silicon nitride layers.

The base includes an array area and a peripheral area, in which the array area is used for forming memory devices of semiconductor memory cells such as storage capacitors, and the peripheral area is used for forming peripheral control circuits.

In the embodiments of the present disclosure, the base at least includes a contact structure for electrically connecting with the formed capacitor structure. In the embodiments of the present disclosure, the material of the contact structure may be any conductive material, such as tungsten (W), cobalt (Co), copper (Cu), aluminum (Al), polysilicon, doped silicon, silicide, or any combination thereof.

In other embodiments, the base may also include a semiconductor substrate, a word line structure located inside the semiconductor substrate, a bit line structure located on the surface of the semiconductor substrate, and an insulating layer covering the contact structure. The material of the semiconductor substrate can be any one selected from silicon (Si), silicon-germanium alloy (SiGe), silicon carbide (SiC), aluminum oxide ($Al_2O_3$), aluminum nitride (AlN), zinc oxide (ZnO), gallium oxide ($Ga_2O_3$), lithium aluminate ($LiAlO_2$), or the like.

In S202, a first mask layer is formed on the stacked structure, in which the first mask layer corresponding to the array area has a first pattern.

In the embodiments of the present disclosure, the first mask layer may be any kind of hard mask layer, for example, a polysilicon layer, a silicon nitride layer, or a spin on carbon layer. The first pattern may be a pattern of capacitor holes or other pattern.

In some embodiments, the first mask layer corresponding to the peripheral area is provided with a second pattern, which may also be a pattern of capacitance holes or other pattern.

It should be noted that in the embodiments of the disclosure, the second pattern has a pattern density less than that of the first pattern.

In S203, ion doping the first mask layer on the array area to obtain a doped first mask layer.

In the embodiments of the disclosure, the ion doped into the first mask layer on the array area may be any type of ion that makes etching of the first mask layer more difficult, for example, a P-type ion or other types of ions. Therefore, the first mask layer has a different etching selectivity ratio of the first mask layer on the array area and on the peripheral area.

In S204, the stacked structure is etched through the doped first mask layer to transfer the first pattern to the stacked structure.

Figure 3A:
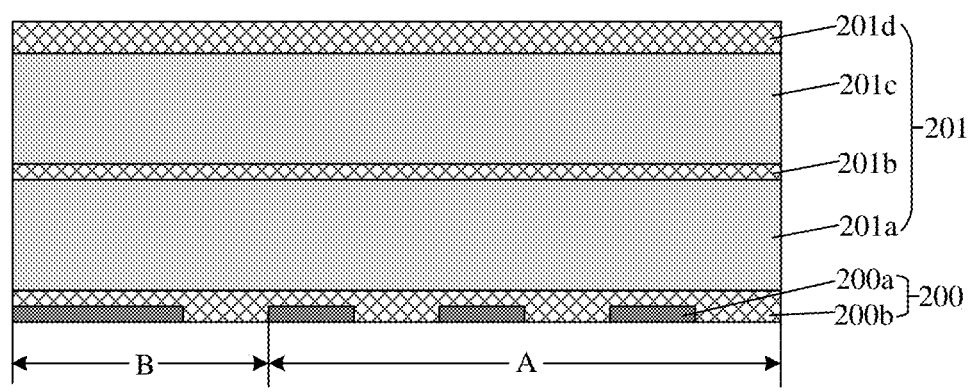
FIG. 3A illustrates a first structural schematic diagram of a semiconductor structure forming process provided by an embodiment of the present disclosure.
Figure 3B:
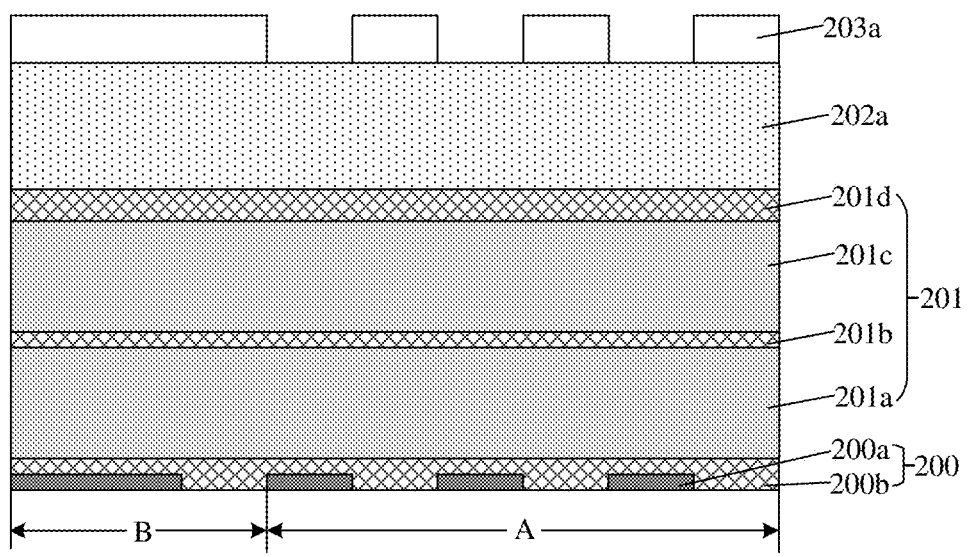
FIG. 3B illustrates a second structural schematic diagram of a semiconductor structure forming process provided by an embodiment of the present disclosure.
Figure 3C:
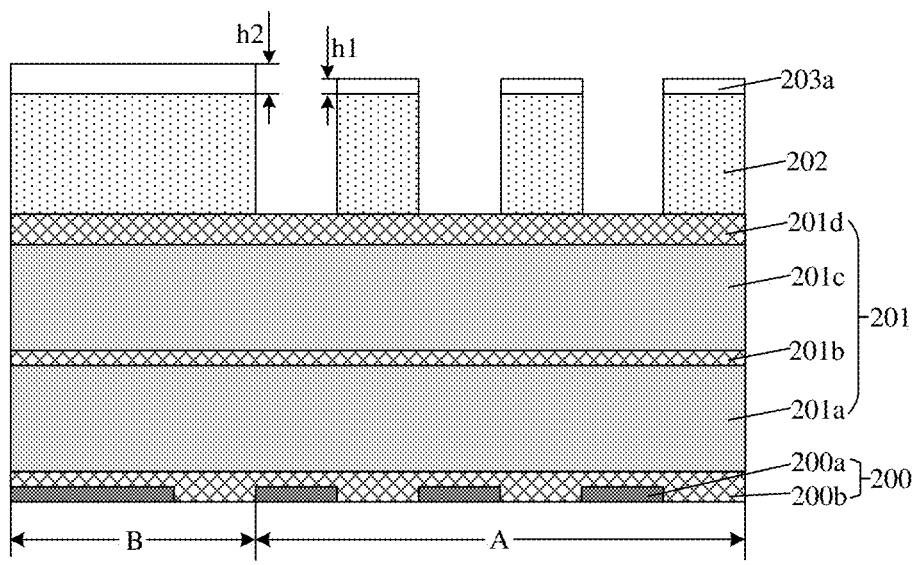
FIG. 3C illustrates a third structural schematic diagram of a semiconductor structure forming process provided by an embodiment of the present disclosure.
Figure 3D:
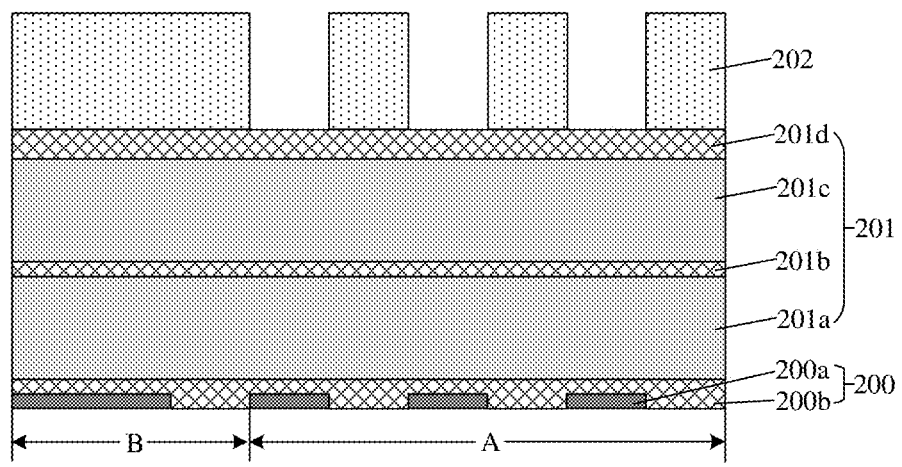
FIG. 3D illustrates a fourth structural schematic diagram of a semiconductor structure forming process provided by an embodiment of the present disclosure.
Figure 3E:
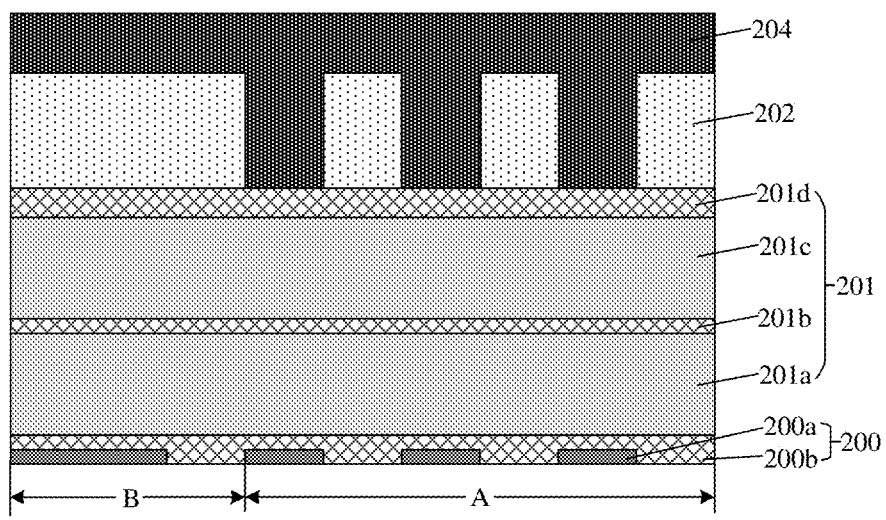
FIG. 3E illustrates a fifth structural schematic diagram of a semiconductor structure forming process provided by an embodiment of the present disclosure.
Figure 3F:
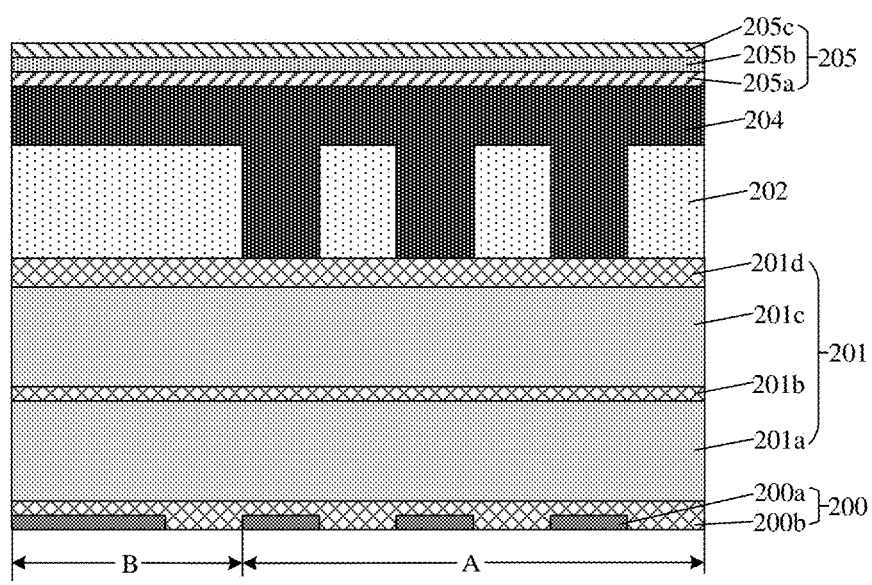
FIG. 3F illustrates a sixth structural schematic diagram of a semiconductor structure forming process provided by an embodiment of the present disclosure.
Figure 3G:
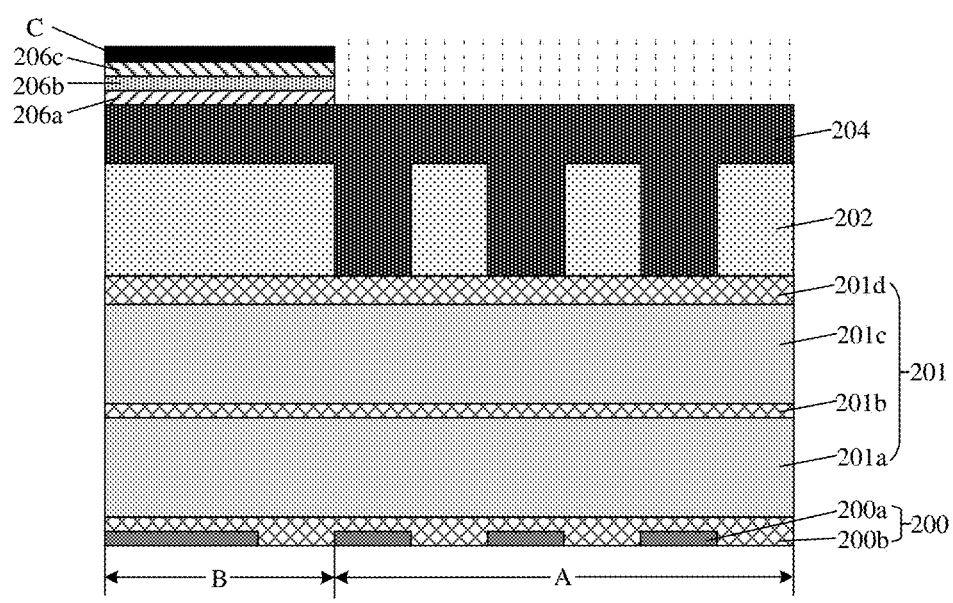
FIG. 3G illustrates a seventh structural schematic diagram of a semiconductor structure forming process provided by an embodiment of the present disclosure.
Figure 3H:
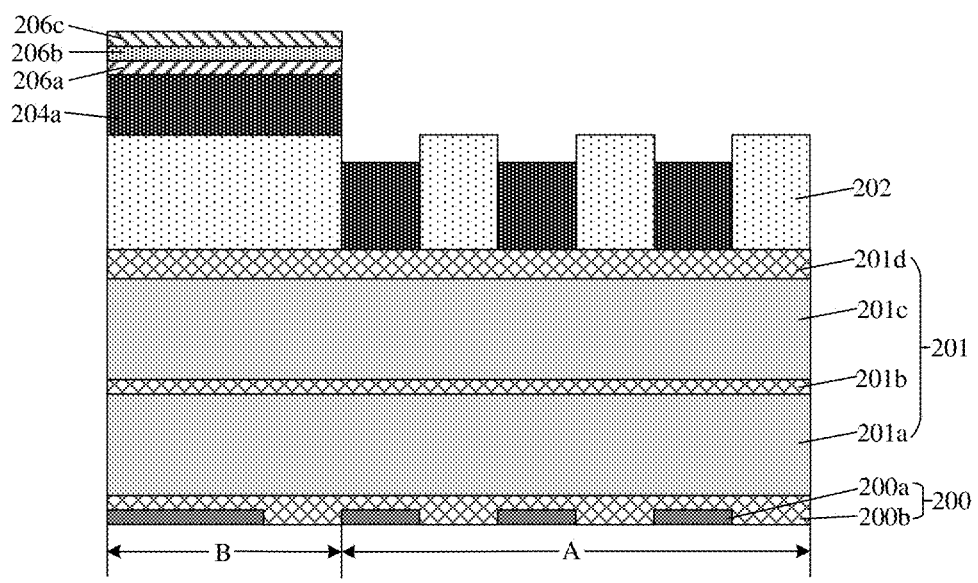
FIG. 3H illustrates an eighth structural schematic diagram of a semiconductor structure forming process provided by an embodiment of the present disclosure.
Figure 3I:
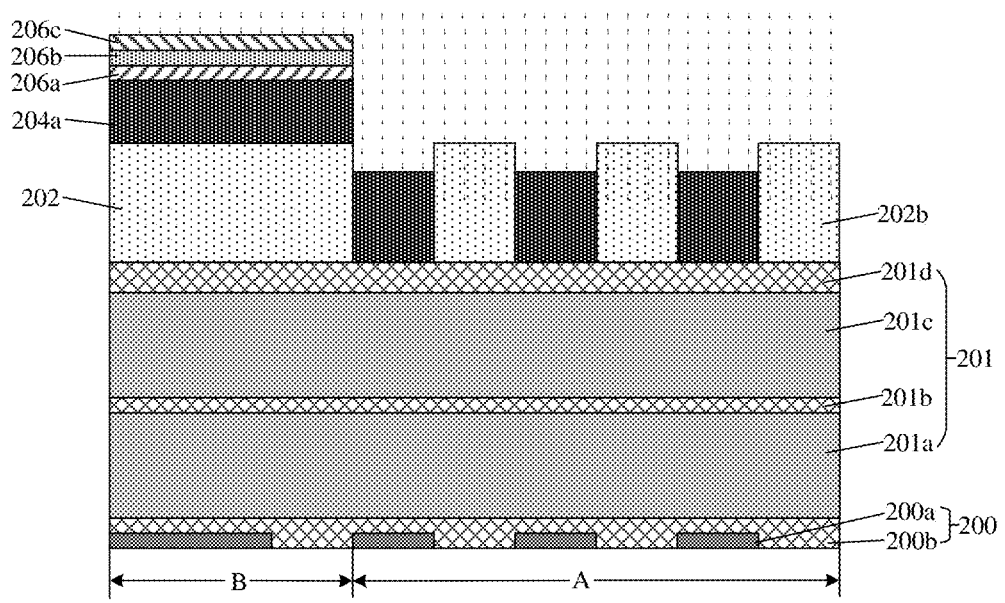
FIG. 3I illustrates a ninth structural schematic diagram of a semiconductor structure forming process provided by an embodiment of the present disclosure.
Figure 3J:
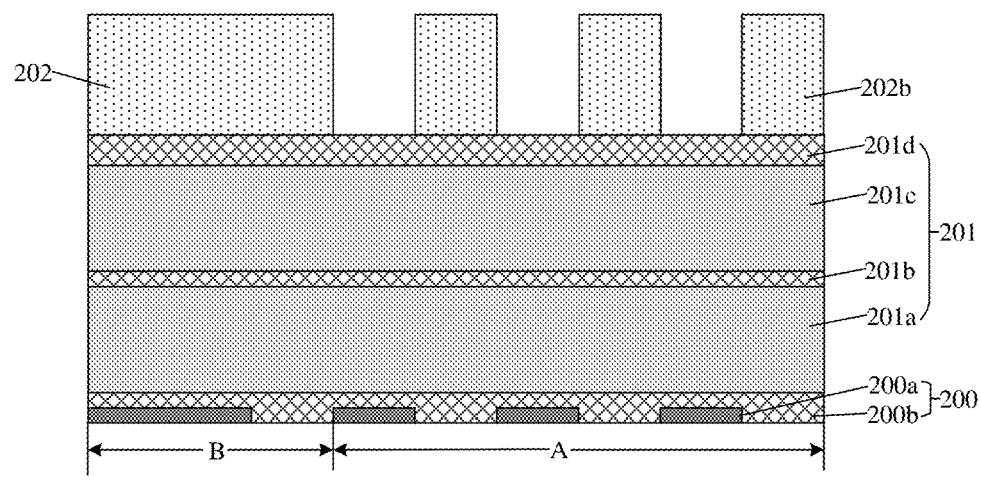
FIG. 3J illustrates a tenth structural schematic diagram of a semiconductor structure forming process provided by an embodiment of the present disclosure.
Figure 3K:
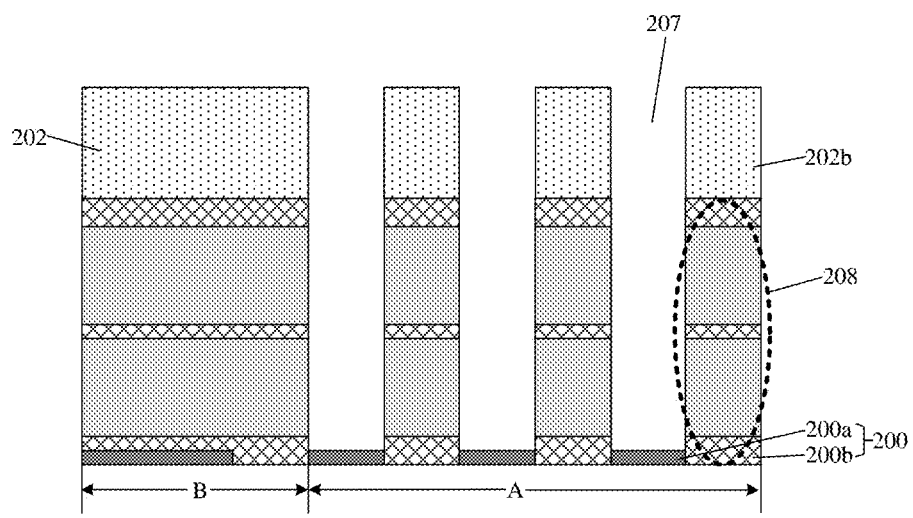
FIG. 3K illustrates an eleventh structural schematic diagram of a semiconductor structure forming process provided by an embodiment of the present disclosure.
Figure 3L:
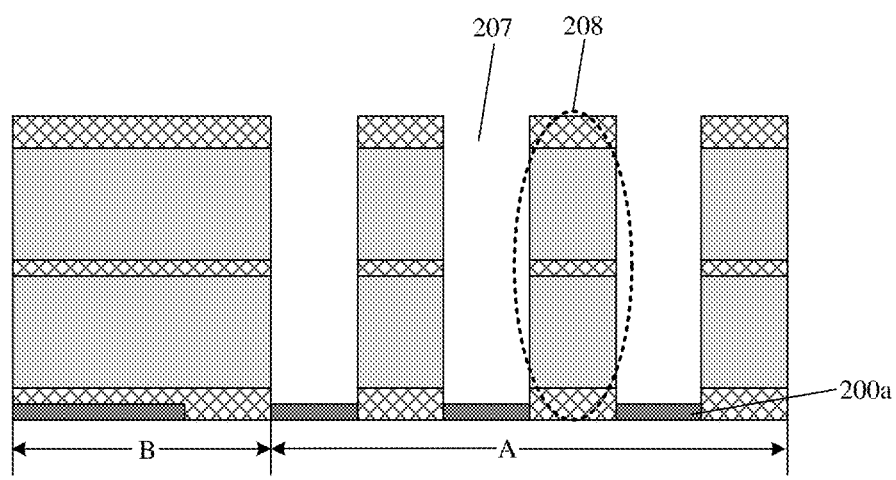
FIG. 3L illustrates a twelfth structural schematic diagram of a semiconductor structure forming process provided by an embodiment of the present disclosure.
Figure 3M:
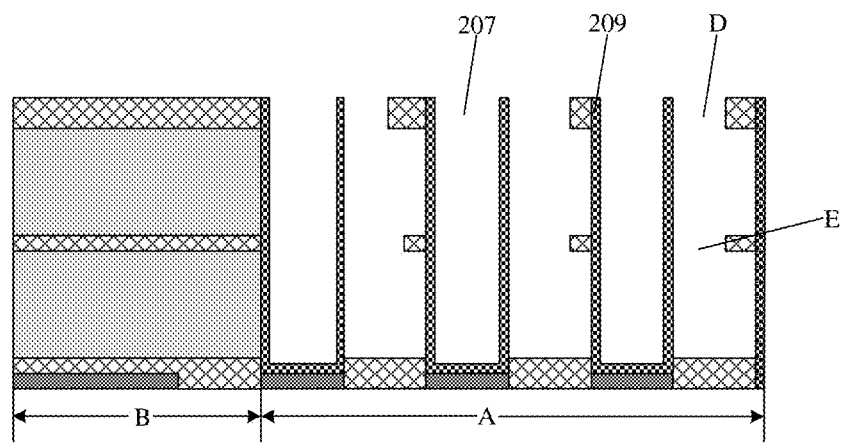
FIG. 3M illustrates a thirteenth structural schematic diagram of a semiconductor structure forming process provided by an embodiment of the present disclosure.
Figure 3N:
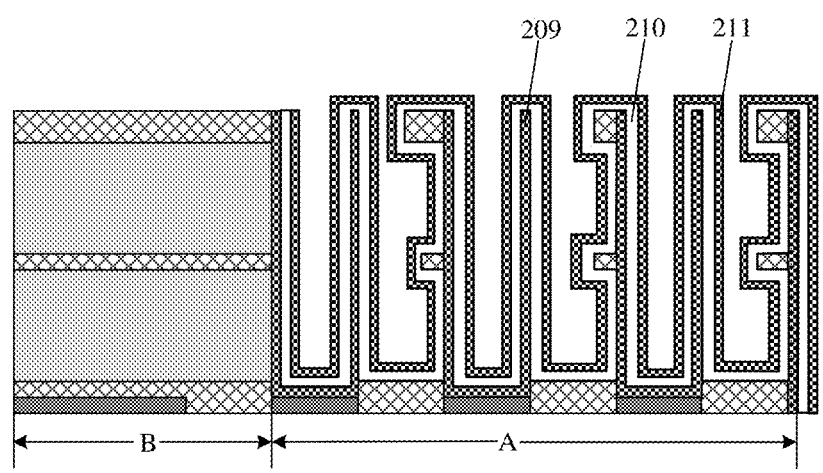
FIG. 3N illustrates a fourteenth structural schematic diagram of a semiconductor structure forming process provided by an embodiment of the present disclosure.

FIGS. 3A-3N illustrate structural schematic diagrams of a semiconductor structure forming process provided by an embodiment of the present disclosure. Next, referring to FIGS. 3A-3N for further detailed description of the method for manufacturing a semiconductor structure provided by an embodiment of the disclosure.

First, performing S201, a stacked structure is formed on a base having an array area and a peripheral area.

As shown in FIG. 3A, the stacked structure 201 is formed on the base 200, in which the stacked structure 201 includes a first sacrificial layer 201a, a first support layer 201b, a second sacrificial layer 201c, and a second support layer 201d stacked in sequence from bottom to top. The base 200 includes an array area A and a peripheral area B and the base 200 is provided with a contact structure 200a and an insulating layer 200b covering the contact structure 200a.

Subsequently, performing S202, a first mask layer is formed on the stacked structure, in which the first mask layer corresponding to the array area has a first pattern.

In some embodiments, S202 may be implemented by the following operations.

In S2021, a first initial mask layer and a second initial mask layer are sequentially formed on the stacked structure, in which the second initial mask layer is provided with the first pattern.

As shown in FIG. 3B, a first initial mask layer 202a and a second initial mask layer 203a are sequentially formed on the surface of the stacked structure 201, in which the second initial mask layer 203a corresponding to the array area A is provided with the first pattern.

In the embodiment of the disclosure, the second mask layer 203a corresponding to the peripheral area B is provided with a second pattern which has a pattern density less than the pattern density of the first pattern.

In embodiments of the present disclosure, the first initial mask layer and the second initial mask layer may be formed by any one of suitable deposition processes, such as chemical vapor deposition (CVD), physical vapor deposition (PVD), atomic layer deposition (ALD), spin coating, or coating.

In S2022, the first initial mask layer is etched through the second initial mask layer to transfer the first pattern to the first initial mask layer to form the first mask layer.

Continuously referring to FIG. 3B, the first initial mask layer 202a is etched through the second initial mask layer 203a to transfer the first pattern of the second initial mask layer 203a to the first initial mask layer 202a, and thus obtain the first mask layer 202 as shown in FIG. 3C. Herein, the first mask layer 202 exposes the surface of part of the stacked structure 201.

It is should be noted that, during etching the first initial mask layer 202a through the second initial mask layer 203a, due to the etch loading effect caused by the difference between the pattern densities of the patterns on the array area A and on the peripheral area B, the thickness h1 of the second initial mask layer on the array area A is smaller than the thickness h2 of the second initial mask layer on the peripheral area B.

In some embodiments, the method for manufacturing the semiconductor structure further includes removing the second initial mask layer after the first mask layer is formed.

As shown in FIG. 3D, the second initial mask layer 203a may be removed by dry etching or wet etching.

Subsequently, performing S203, the first mask layer on the array area is doped to obtain a doped first mask layer.

In some embodiments, S203 may include the following operations.

In S2031, a sacrificial layer is deposited on the first mask layer and part of the stacked structure.

In the embodiments of the present disclosure, the sacrificial layer may be a spin-on hard mask (SOH) layer, a spin-on carbon layer, or other hard mask layer.

Continuously referring to FIG. 3D, the sacrificial layer 204 as shown in FIG. 3E is formed on the first mask layer 202 and part of the stacked structure 201. In the embodiment of the disclosure, the sacrificial layer 204 may be formed by any suitable deposition process.

In S2032, the sacrificial layer on the array area is etched to expose part of the first mask layer on the array area.

In some embodiments, S2032 may be implemented by the following operations.

In S10, a second mask layer is formed on the sacrificial layer.

In the embodiments of the present disclosure, the second mask layer includes an anti-reflective coating (ARC) and a photoresist (PR) layer, and the anti-reflective coating includes a dielectric anti-reflective coating (DARC) and a bottom anti-reflective coating (BARC).

Continuously referring to FIG. 3E, the second mask layer 205 as shown in FIG. 3F is formed on the sacrificial layer 204, which includes a dielectric anti-reflective coating 205a, a bottom anti-reflective coating 205b and a photoresist layer 205c stacked in sequence from bottom to top. In the embodiment of the disclosure, the dielectric anti-reflective coating 205a, the bottom anti-reflective coating 205b and the photoresist layer 205c may be formed by any suitable deposition process.

In S11, the second mask layer is patterned to expose the part of the sacrificial layer corresponding to the array area.

Continuously referring to FIGS. 3F and 3G, the photoresist layer 205c, the bottom anti-reflective coating 205b and the dielectric anti-reflective coating 205a are exposed using a preset mask C to obtain the patterned photoresist layer 206c, the patterned bottom anti-reflective coating 206b and the patterned dielectric anti-reflective coating 206a as shown in FIG. 3G, and expose the part of the sacrificial layer 204 corresponding to the array area A.

In S12, the exposed part of the sacrificial layer is etched to expose part of the first mask layer.

As shown in FIG. 3H, part of the exposed sacrificial layer is etched away and thus the part of the sacrificial layer 204a on the peripheral area B is retained and the first mask layer 202 is exposed. Here, the part of the exposed sacrificial layer may be etched by dry etching or wet etching.

In S2033, the exposed first mask layer is ion doped to obtain the doped first mask layer.

In the embodiments of the disclosure, the process for ion doping on the exposed first mask layer can be performed as follows. High-speed ions are generated by a specific ion generator, and the surface of the exposed first mask layer is bombarded by the high-speed ions, thereby achieving the doped exposed first mask layer. Here the species of ions for doping the exposed first mask layer may be P-type ions for example boron ions. That is, in the embodiments of the disclosure, the exposed first mask layer is subjected to P-type ion doping, regardless of whether the first mask layer is undoped or doped with N-type ions or P-type ions before the ion doping, so that the first mask layer after the P-type ion doping has an etching rate lower than that of the first mask layer before the ion doping.

In some embodiments, the thickness of the first mask layer is between 500 nm and 800 nm, the energy of the ion doping to the exposed first mask layer is between 10 Kev and 100 Kev, and the dose of the ion doping to the exposed first mask layer is between $10^{13}$ Atom/cm$^2$ and $10^{15}$ Atom/cm$^2$.

It should be noted that, in some embodiments of the disclosure, doping the exposed first mask layer to a degree that the etching selectivity ratio of the doped first mask layer to the stacked structure is larger than that of the undoped first mask layer to the stacked structure.

Continuously referring to FIG. 3H, the exposed first mask layer on the array area A is ion doped to obtain the doped first mask layer 202b on the array area A as shown in FIG. 3I. Since the surface of the first mask layer on the peripheral area B is covered with the part of the sacrificial layer 204a, the patterned photoresist layer 206c, the patterned bottom anti-reflective coating 206b and the patterned dielectric anti-reflective coating 206a, the first mask layer 202 on the peripheral area B is not ion doped.

In the embodiments of the disclosure, the etching selectivity ratio between the doped first mask layer 202b and the stacked structure 201 is greater than the etching selectivity ratio between the first mask layer 202 and the stacked structure 201.

In some embodiments, after ion doping the exposed part of the first mask layer, the method for manufacturing the semiconductor structure further includes removing the second mask layer on the peripheral area and the remaining sacrificial layer to expose the first mask layer on the peripheral area.

As shown in FIG. 3J, after the doped first mask layer 202b is obtained, the second mask layer (i.e., the patterned photoresist layer 206c, the patterned bottom anti-reflective coating 206b and the patterned dielectric anti-reflective coating 206a) and the remaining sacrificial layer on the peripheral area B may be removed by wet etching or dry etching, to expose the first mask layer 202 on the peripheral area B.

In the embodiments of the present disclosure, the purpose of ion doping the first mask layer on the array area is to increase the etching difficulty of the first mask layer on the array area, so that the etching selectivity ratio between the doped first mask layer and the stacked structure is greater than the etching selectivity ratio between the undoped first mask layer and the stacked structure.

Next, performing S204, the stacked structure is etched through the doped first mask layer to transfer the first pattern to the stacked structure.

In some embodiments, the first pattern may be a pattern of capacitor holes, and S204 may include the following operations.

Through the doped first mask layer, the second support layer, the second sacrificial layer, the first support layer and the first sacrificial layer are etched sequentially, to transfer the pattern of capacitor holes to the stacked structure, and a plurality of capacitor holes and etched pillars each located between two adjacent capacitor holes are formed in the stacked structure, in which the capacitor holes expose part of the contact structure.

Continuously referring to FIG. 3J, through the doped first mask layer 202b, the second support layer 201d, the second sacrificial layer 201c, the first support layer 201b, the first sacrificial layer 201a and the part of the insulating layer 200b are sequentially etched to form a plurality of capacitor holes 207 and etched pillars (i.e., the pattern defining the capacitor holes) 208 between two adjacent capacitor holes as shown in FIG. 3K. Herein, each of the capacitor holes 207 exposes a contact structure 200a.

In some embodiments, after the capacitor holes are formed, the method for manufacturing the semiconductor structure further includes removing the first mask layer.

As shown in FIG. 3L, after the capacitor holes 207 are formed, the first mask layer (including the doped first mask layer 202b on the array area A and the undoped first mask layer 202 on the peripheral area B) is removed by dry etching, exposing the top surface of the etched pillars 208.

In the embodiments of the disclosure, due to the etching selectivity ratio between the doped first mask layer on the array area and the stacked structure is larger than the etching selectivity ratio between the undoped first mask layer on the peripheral region and the stacked structure, such that the etch loading effect occurred when etching the first mask layer on different regions can be counteracted. In this way, when the first mask layer is removed by subsequent etching, the etched pillars will not be damaged, and thus the capacity of the formed capacitor structure will not be affected.

In some embodiments, after the first mask layer is removed, the method for manufacturing the semiconductor structure further includes processing the etched pillars to form a capacitor structure.

In some embodiments, processing the etched pillars to form the capacitor structure includes the following operations.

In S20, a first electrode layer is formed on inner walls of the capacitor holes and surfaces of the etched pillars.

The first electrode layer may be a titanium nitride layer.

In S21, a first opening is formed in the second support layer.

In S22, the second sacrificial layer is removed through the first opening.

In S23, a second opening is formed in the first support layer.

In S24, the first sacrificial layer is removed through the second opening.

As shown in FIG. 3M, the first electrode layer 209 is formed on the inner walls of the capacitor holes 207 and the surfaces of the etched pillars; a first opening D is formed in the second support layer of each etched pillar through which the second sacrificial layer of the etched pillar is removed; and a second opening E is formed in the first support layer of each etched pillar through which the first sacrificial layer of the etched pillar is removed.

In the embodiments of the present disclosure, dry etching such as plasma etching may be employed to form the first openings D and the second openings E.

In the embodiments of the disclosure, wet etching, for example using an etching solution of such as sulfuric acid, hydrofluoric acid, nitric acid, etc., may be employed, to remove the second sacrificial layer and the first sacrificial layer by.

In S25, a dielectric layer and a second electrode layer are sequentially deposited on the surface of the first electrode layer to form the capacitor structure.

As shown in FIG. 3N, a dielectric layer 210 and a second electrode layer 211 are formed on the surface of the first electrode layer 209. In the embodiment of the disclosure, the dielectric layer 210 may be a zirconia layer and/or an aluminum oxide layer, and may also be other high dielectric constant material layer; and the second electrode layer 211 and the first electrode layer 209 may be the same or different.

In some embodiments, the method for forming the semiconductor structure further includes depositing a conductive material in the capacitor holes where the dielectric layer and the second electrode layer have been formed. The conductive material may be polysilicon or any other suitable conductive material such as tungsten, cobalt or doped polysilicon.

In the method for manufacturing the semiconductor structure provided by the embodiments of the disclosure, by doping the first mask layer on the array area, the first mask layer on the array area is allowed to have a different etching selectivity ratio from the first mask layer on the peripheral area, so that the etch loading effect brought out when etching different areas of the first mask layer can be counteracted, and thus the integrity of the capacitor pattern and the capacity of the formed capacitor structure can be improved.

Figure 4:
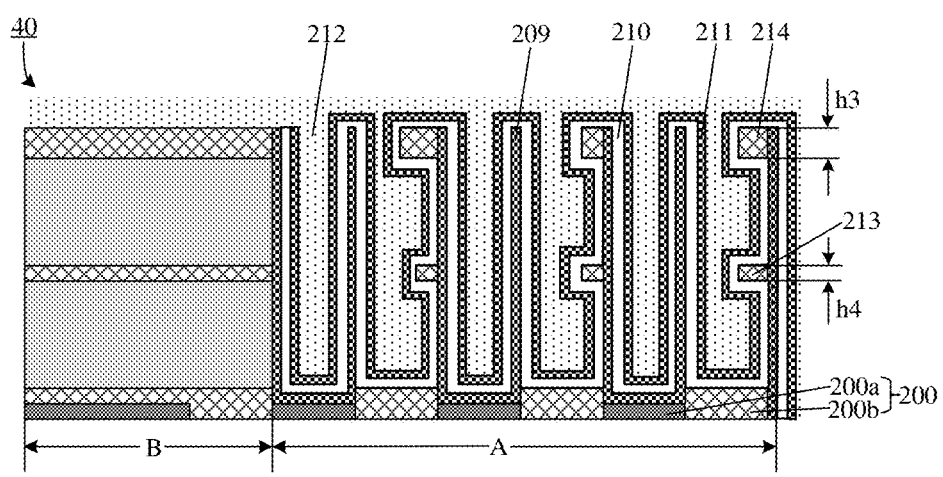
FIG. 4 is a schematic cross-sectional diagram of a semiconductor structure provided by an embodiment of the present disclosure.

In addition, embodiments of the present disclosure also provide a semiconductor structure prepared by the method for manufacturing a semiconductor structure provided in the above embodiments. FIG. 4 is a schematic cross-sectional diagram of a semiconductor structure provided by an embodiment of the present disclosure. As shown in FIG. 4, the semiconductor structure 40 includes a base 200 and a capacitor structure. The base 200 includes a contact structure 200a and an insulating layer covering the contact structure 200a, in which the contact structure 200a is configured to electrically connect with the formed capacitor structure.

In the embodiment of the disclosure, the base 200 includes the array area A and the peripheral area B, and the capacitor structure is located on the surface of the array area A of the base 200.

Continuously referring to FIG. 4, the capacitor structure includes the first electrode layer 209, the dielectric layer 210 and the second electrode layer 211 stacked in sequence, and the conductive material 212 is filled in the capacitor holes 207 where the dielectric layer 210 and the second electrode layer 211 have been formed.

In the embodiments of the present disclosure, the capacitor structure is a cup-shaped structure. The capacitor structure further includes a first support layer 213 and a second support layer 214 arranged in parallel. The first support layer 213 is arranged at the middle periphery of the capacitor structure, the second support layer 214 is arranged at the top periphery of the capacitor structure, and the first support layer 213 and the second support layer 214 are together used for supporting the capacitor structure.

In some embodiments, the thickness h3 of the second support layer 214 is greater than the thickness h4 of the first support layer 213, so that a better support effect can be achieved.

Similar to the method for manufacturing the semiconductor structure in the above-mentioned embodiment, with respect to the semiconductor structure in the embodiments of the disclosure, the technical features not disclosed in detail in the embodiments of the disclosure can be understood with reference to the above-mentioned embodiments, and thus will not be repeated here.

Since the semiconductor structure provided by the embodiments of the disclosure has a complete capacitor pattern, the capacity of the formed capacitor structure can be improved.

In several embodiments provided by the present disclosure, it should be understood that the disclosed apparatus and method may be implemented in a non-targeted manner. The embodiments of a device described above are only illustrative, for example, the division of units is only a logical function division, and can be implemented in other ways, for example, multiple units or elements can be combined, or integrated into another system, or some features can be ignored or not implemented. In addition, the components shown or discussed can be coupled or directly coupled with each other.

The units described above as separate elements may or may not be physically separated, and the components displayed as a unit may or may not be a physical unit, i.e. it may be located in one place or may be distributed over multiple network units. Part or all of the units can be selected according to actual requirements to achieve the purpose of the embodiment solution.

The features disclosed in the embodiments of several methods or devices provided in the disclosure can be arbitrarily combined as long as there is no conflict therebetween to obtain a new embodiment of a method or a device.

The descriptions above are only some implementations of the embodiments of the present disclosure, and are not intended to limit the scope of protection of the embodiments of the present disclosure. Any change and replacement is easily to be conceived of within the protection scope of the embodiments of the disclosure by those skilled in the art, and fall with the protection scope of the present disclosure. Therefore, the protection scope of the embodiments of the disclosure is defined by the claims.

In the embodiments of the disclosure, by doping the first mask layer on the array area, the first mask layer on the array area is allowed to have a different etching selectivity ratio from the first mask layer on the peripheral area, so that the etch loading effect brought out when etching different areas the first mask layer can be counteracted, and thus the integrity of the capacitor pattern and the capacity of the formed capacitor structure can be improved.

What is claimed is:

1. A method for manufacturing a semiconductor structure, comprising:
   forming a stacked structure on a base having an array area and a peripheral area;
   forming a first mask layer on the stacked structure, wherein the first mask layer corresponding to the array area has a first pattern;
   ion doping the first mask layer on the array area to obtain a doped first mask layer; and
   etching the stacked structure through the doped first mask layer to transfer the first pattern to the stacked structure;
   wherein
   ion doping the first mask layer on the array area to obtain the doped first mask layer comprises:
   depositing a sacrificial layer on the first mask layer and the part of the stacked structure;
   etching the sacrificial layer on the array area to expose part of the first mask layer on the array area; and
   ion doping the exposed first mask layer to obtain the doped first mask layer.

2. The method of claim 1, wherein
   forming the first mask layer on the stacked structure comprises:
   forming a first initial mask layer and a second initial mask layer sequentially on the stacked structure, wherein the second initial mask layer is provided with the first pattern; and
   etching the first initial mask layer through the second initial mask layer to transfer the first pattern into the first initial mask layer to form the first mask layer,
   wherein the first mask layer exposes a surface of part of the stacked structure.

3. The method of claim 2, further comprising:
   removing the second initial mask layer after the first mask layer is formed.

4. The method of claim 2, wherein
   etching the sacrificial layer on the array area to expose the part of the first mask layer on the array area comprises:
   forming a second mask layer on the sacrificial layer;
   patterning the second mask layer to expose part of the sacrificial layer corresponding to the array area; and
   etching the exposed part of the sacrificial layer to expose the part of the first mask layer.

5. The method of claim 4, further comprising:
   removing the second mask layer on the peripheral area and the remaining sacrificial layer to expose the first mask layer on the peripheral area after ion doping the exposed part of the first mask layer.

6. The method of claim 5, wherein
   an etching selectivity ratio of the doped first mask layer to the stacked structure is greater than an etching selectivity ratio of the first mask layer to the stacked structure.

7. The method of claim 4, wherein
   the first mask layer corresponding to the peripheral area is provided with a second pattern which has a pattern density less than a pattern density of the first pattern.

8. The method of claim 1, wherein
   the first pattern is a pattern of capacitor holes and the base is provided with a contact structure corresponding to the pattern of capacitor holes.

9. The method of claim 8, wherein
   the stacked structure comprises a first sacrificial layer, a first support layer, a second sacrificial layer and a second support layer stacked in sequence from bottom to top.

10. The method of claim 9, wherein
    etching the stacked structure through the doped first mask layer to transfer the first pattern to the stacked structure comprises:
    etching the second support layer, the second sacrificial layer, the first support layer and the first sacrificial layer in sequence through the doped first mask layer to transfer the pattern of capacitor holes to the stacked structure, and forming a plurality of capacitor holes and etched pillars each between two adjacent capacitor holes in the stacked structure,
    wherein the capacitor holes expose part of the contact structure.

11. The method of claim 10, further comprising:
    removing the first mask layer after the capacitor holes are formed.

12. The method of claim 11, further comprising:
    processing the etched pillars to form a capacitor structure.

13. The method of claim 12, wherein
    processing the etched pillars to form the capacitor structure comprises:
    forming a first electrode layer on inner walls of the capacitor holes and on surfaces of the etched pillars;
    forming a first opening in the second support layer;
    removing the second sacrificial layer through the first opening;
    forming a second opening in the first support layer;
    removing the first sacrificial layer through the second opening; and
    depositing a dielectric layer and a second electrode layer sequentially on a surface of the first electrode layer to form the capacitor structure.

* * * * *